US012130093B2

(12) United States Patent
Lee et al.

(10) Patent No.: US 12,130,093 B2
(45) Date of Patent: Oct. 29, 2024

(54) DEVICE AND METHOD FOR A TWO PHASE HEAT TRANSFER

(71) Applicant: NATIONAL UNIVERSITY OF SINGAPORE, Singapore (SG)

(72) Inventors: Poh Seng Lee, Singapore (SG); Lee Liong Matthew Law, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 16/412,152

(22) Filed: May 14, 2019

(65) Prior Publication Data
US 2019/0264992 A1   Aug. 29, 2019

Related U.S. Application Data

(63) Continuation of application No. 15/308,603, filed as application No. PCT/SG2015/050088 on Apr. 30, 2015, now abandoned.
(Continued)

(51) Int. Cl.
*F28F 13/02* (2006.01)
*F28D 15/02* (2006.01)
(Continued)

(52) U.S. Cl.
CPC .............. *F28F 13/02* (2013.01); *F28D 15/02* (2013.01); *F28F 13/003* (2013.01); *G01N 25/18* (2013.01);
(Continued)

(58) Field of Classification Search
CPC .......... F28F 13/00; F28F 13/003; F28F 13/02; F28F 2250/04; F28F 2260/02;
(Continued)

(56) References Cited

U.S. PATENT DOCUMENTS 3,741,292 A * 6/1973 Aakalu ................. H01L 23/427
165/104.21
5,421,406 A   6/1995 Furusawa et al.
(Continued)

FOREIGN PATENT DOCUMENTS

JP      10009712 A    1/1998
JP    2004111652 A    4/2004
(Continued)

OTHER PUBLICATIONS

Bertsch et al. Refrigerant Flow Boiling Heat Transfer in Parallel Microchannels as Function of Local vapor Quality Science Direct (Year: 2008).*
(Continued)

*Primary Examiner* — Len Tran
*Assistant Examiner* — Gustavo A Hincapie Serna
(74) *Attorney, Agent, or Firm* — Conley Rose, P.C.

(57) ABSTRACT

The invention provides a two phase heat transfer device comprising an inlet for receiving a heat transfer fluid, and; an array of heat transfer fins in spaced relation; primary spaces between said heat transfer fins defining primary channels parallel to a path from the inlet to outlet, and; oblique spaces between said heat transfer fins defining oblique channels arranged at an angle to said primary channels. It is preferable that walls defining the primary and oblique spaces provide nucleate boiling regions and the interruption of fully developed convective boiling regions when a heat transfer fluid is passed through the inlet to the outlet.

15 Claims, 20 Drawing Sheets

Related U.S. Application Data

(60) Provisional application No. 61/987,615, filed on May 2, 2014.

(51) Int. Cl.
*F28F 13/00* (2006.01)
*G01N 25/18* (2006.01)
*H01L 23/40* (2006.01)
*H01L 23/427* (2006.01)
*H01L 23/473* (2006.01)
*H05K 7/20* (2006.01)

(52) U.S. Cl.
CPC ........ *H01L 23/4006* (2013.01); *H01L 23/427* (2013.01); *H01L 23/473* (2013.01); *H05K 7/20327* (2013.01); *H05K 7/20336* (2013.01); *F28F 2250/04* (2013.01); *F28F 2260/02* (2013.01); *H01L 2924/0002* (2013.01)

(58) Field of Classification Search
CPC ... F28D 15/02; H01L 23/4006; H01L 23/427; H01L 23/473; H01L 2924/0002; H05K 7/20; H05K 7/20327; H05K 7/20336; G01N 25/18
USPC ......................................................... 165/236
See application file for complete search history.

(56) References Cited

U.S. PATENT DOCUMENTS

| | | | | |
|---|---|---|---|---|
| 5,835,345 | A * | 11/1998 | Staskus | H01S 5/02423 361/699 |
| 6,273,186 | B1 | 8/2001 | Ognibene et al. | |
| 6,301,109 | B1 * | 10/2001 | Chu | H01L 23/473 257/E23.098 |
| 6,343,016 | B1 * | 1/2002 | Lin | H01L 23/3672 361/704 |
| 7,139,172 | B2 | 11/2006 | Bezama et al. | |
| 7,672,129 | B1 * | 3/2010 | Ouyang | H01L 23/473 174/15.1 |
| 7,908,874 | B2 * | 3/2011 | Weber | H01Q 1/02 62/119 |
| 8,291,967 | B2 * | 10/2012 | Yoshida | H05K 7/20936 165/80.4 |
| 8,479,806 | B2 * | 7/2013 | Qu | H01L 23/427 165/80.4 |
| 2003/0136545 | A1 | 6/2003 | Lin et al. | |
| 2004/0069451 | A1 * | 4/2004 | Meyer | H01L 23/473 165/80.2 |
| 2004/0188066 | A1 * | 9/2004 | Upadhya | F28D 15/0266 165/80.4 |
| 2006/0142401 | A1 * | 6/2006 | Tonkovich | B01B 1/005 518/726 |
| 2006/0237166 | A1 | 10/2006 | Otey et al. | |
| 2006/0279936 | A1 | 12/2006 | Karidis et al. | |
| 2007/0034361 | A1 * | 2/2007 | Lu | F28F 13/187 165/133 |
| 2009/0166018 | A1 * | 7/2009 | Lundgreen | F24F 6/18 165/173 |
| 2011/0042041 | A1 * | 2/2011 | Zrodnikov | F28C 3/005 165/104.19 |
| 2012/0111550 | A1 * | 5/2012 | Kuno | H05K 7/20936 165/181 |
| 2012/0243180 | A1 * | 9/2012 | Lee | F28F 13/08 361/702 |
| 2013/0202278 | A1 * | 8/2013 | Hong | F04B 19/24 392/471 |
| 2014/0071628 | A1 * | 3/2014 | Brunschwiler | H01L 29/0657 361/700 |
| 2014/0183957 | A1 * | 7/2014 | Duchesneau | F01K 13/006 307/64 |
| 2014/0209288 | A1 * | 7/2014 | Simon | F25B 23/006 165/281 |
| 2014/0311725 | A1 * | 10/2014 | Balasubramanian | H01L 23/473 165/168 |
| 2015/0198380 | A1 * | 7/2015 | Haj-Hariri | F28D 15/02 62/3.2 |
| 2017/0176114 | A1 * | 6/2017 | Kandlikar | H01L 23/44 |
| 2017/0191765 | A1 | 7/2017 | Lee et al. | |

FOREIGN PATENT DOCUMENTS

| | | |
|---|---|---|
| JP | 2009176881 A | 8/2009 |
| JP | 2013120897 A * | 6/2013 |
| WO | 2015167398 A1 | 11/2015 |

OTHER PUBLICATIONS

Foreign Communication From a Related Counterpart Application, International Search Report and Written Opinion dated Jul. 21, 2015, International Application No. PCT/SG2015/050088 filed on Apr. 30, 2015.
Lee, Poh Seng, et al., "Device and Method for a Two Phase Heat Transfer," filed Nov. 2, 2016, U.S. Appl. No. 15/308,603.
Qu, Weilin, et al., "Experimental study of saturated flow boiling heat transfer in an array of staggered micro-pin-fins", International Journal of Heat and Mass Transfer, 52, pp. 1853-1863, 2009.
Steinke, Mark E., et al., "Single-Phase Heat Transfer Enhancement Techniques in Microchannel and Minichannel Flows", ASME, Microchannels and Minichannels; Jun. 17, 2004.
Kosar, Ali, et al., "Boiling heat transfer in a hydrofoil-based micro pin fin heat sink", International Journal of Heat and Mass Transfer, 50, pp. 1018-1034, 2007.
Office Action dated Mar. 7, 2018, U.S. Appl. No. 15/308,603, filed Nov. 2, 2016.
Final Office Action dated Jan. 15, 2019, U.S. Appl. No. 15/308,603, filed Nov. 2, 2016.

* cited by examiner

DEVICE AND METHOD FOR A TWO PHASE HEAT TRANSFER

CROSS REFERENCE TO RELATED APPLICATIONS

The present application is a continuation of and claims priority to U.S. patent application Ser. No. 15/308,603, filed Nov. 2, 2016, and entitled "DEVICE AND METHOD FOR A TWO PHASE HEAT TRANSFER," which is a filing under 35 U.S.C. 371 as the National Stage of International Application No. PCT/SG2015/050088, filed Mar. 30, 2015, entitled "DEVICE AND METHOD FOR A TWO PHASE HEAT TRANSFER," which claims the benefit of U.S. Provisional Application No. 61/987,615 filed on May 2, 2014, each of which are incorporated herein by reference in their entirety for all purposes

FIELD OF THE INVENTION

The invention relates to the dissipation of heat from electronic devices using a heat transfer device. In particular, the invention relates to the creation of two phase flow in such devices.

BACKGROUND

Flow boiling heat transfer in micro-channels has been a subject of wide interest due to its ability to dissipate high heat fluxes from a relatively small footprint. In view of this advantage and the ever-increasing need for ultra-high heat flux removal, various micro-channel design schemes have been put in place to further improve heat transfer performance and reduce pressure drop penalty. Nevertheless, the main purpose of these design improvements is to stabilise the flow boiling process by reducing pressure drop fluctuations caused by unsteady boiling within the micro-channels.

Pressure drop oscillation is associated with fairly periodic, large amplitude fluctuations in inlet and outlet pressure as well as heat sink temperature. This type of instability can be suppressed by throttling a control valve situated upstream of the heat sink. Parallel channel instability, on the other hand, produces only mild fluctuations in the net pressure and temperature, and therefore, does not play a very significant role in overall flow boiling instabilities. However, this type of instability causes the flow in an individual channel to oscillate between different flow regimes even at constant operating conditions.

Pressure oscillations are related with premature critical heat flux (CHF) conditions, in a way that the phase-change process tends to be exceedingly rapid, instigating hydrodynamic fluctuations. CHF is the maximum heat dissipation of a heat sink before burn-out, which is the limiting factor in achieving higher heat fluxes. CHF is characterised by an extreme heat sink temperature overshoot caused by sudden dry-out in parallel micro-channels.

In spite of the abovementioned drawbacks, flow boiling heat transfer in micro-channels remains an interesting heat transfer technology due to its effectiveness in heat dissipation at a small surface-to-volume ratio.

SUMMARY OF INVENTION

The invention provides a two phase heat transfer device comprising an inlet for receiving a heat transfer fluid, and; an array of heat transfer fins in spaced relation; primary spaces between said heat transfer fins defining primary channels parallel to a path from the inlet to outlet, and; oblique spaces between said heat transfer fins defining oblique channels arranged at an angle to said primary channels. It is preferable that walls defining the primary and oblique spaces provide nucleate boiling regions and the interruption of fully developed convective boiling regions.

As compared with straight fins, there is significant augmentation in heat transfer and the delay in the onset of critical heat flux for the oblique-finned micro-channels. This is due to enhancement in the flow boiling stability offered by the oblique fins in terms of reduced wall temperature gradients and pressure fluctuations. Flow visualisations performed on both micro-channel geometries show increased bubbles generation in the nucleate boiling region. In one embodiment, the oblique channels, at an aperture between the primary and oblique channels, may interrupt fully developed thin liquid and so causing a continuously developing thin liquid-film in the convective boiling region for the oblique fins.

In one embodiment, the oblique channels may be arranged to provide pathways for bubbles formed from said nucleate boiling regions between said primary channels. In this way, by providing an alternate pathway for the bubbles and slugs to escape, this avoids obstructing the primary channel which may increase flow resistance. In the case where the oblique channels are narrower than the primary channels, bubbles following this alternate pathway may prevent the bubbles developing to a larger size. For instance, the oblique channels may be half the width of the primary channels.

In a further embodiment, the heat transfer fluid may enter entering the inlet close to a saturation temperature.

In one embodiment, oblique angle may be in the range 10° to 50°. Further, the angle may be in the range 30° to 50°. Still further, the angle may be 50°.

In one embodiment, the two phase heat transfer device may be arranged to dissipate applied heat flux greater than 20 W/cm2.

In one embodiment, a mass flux for said heat transfer fluid may be in the range 175 kg/m2 to 349 kg/m2. Further, it may be in the range 218 kg/m2 to 306 kg/m2. Still further, it may be 262 kg/m2.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

DETAILED DESCRIPTION

Figure 1:
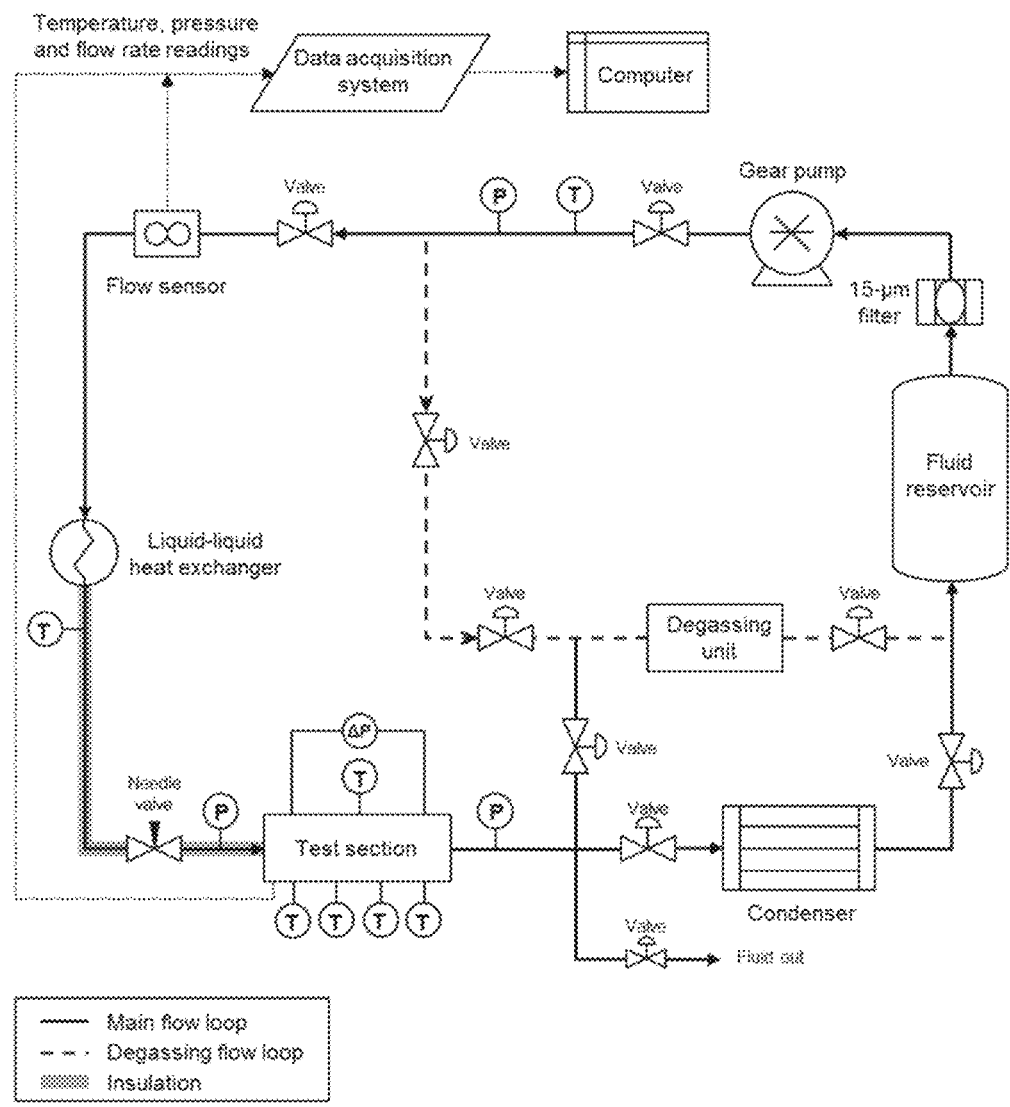
FIG. 1 Schematic diagram of the experimental flow loop
Figure 2:
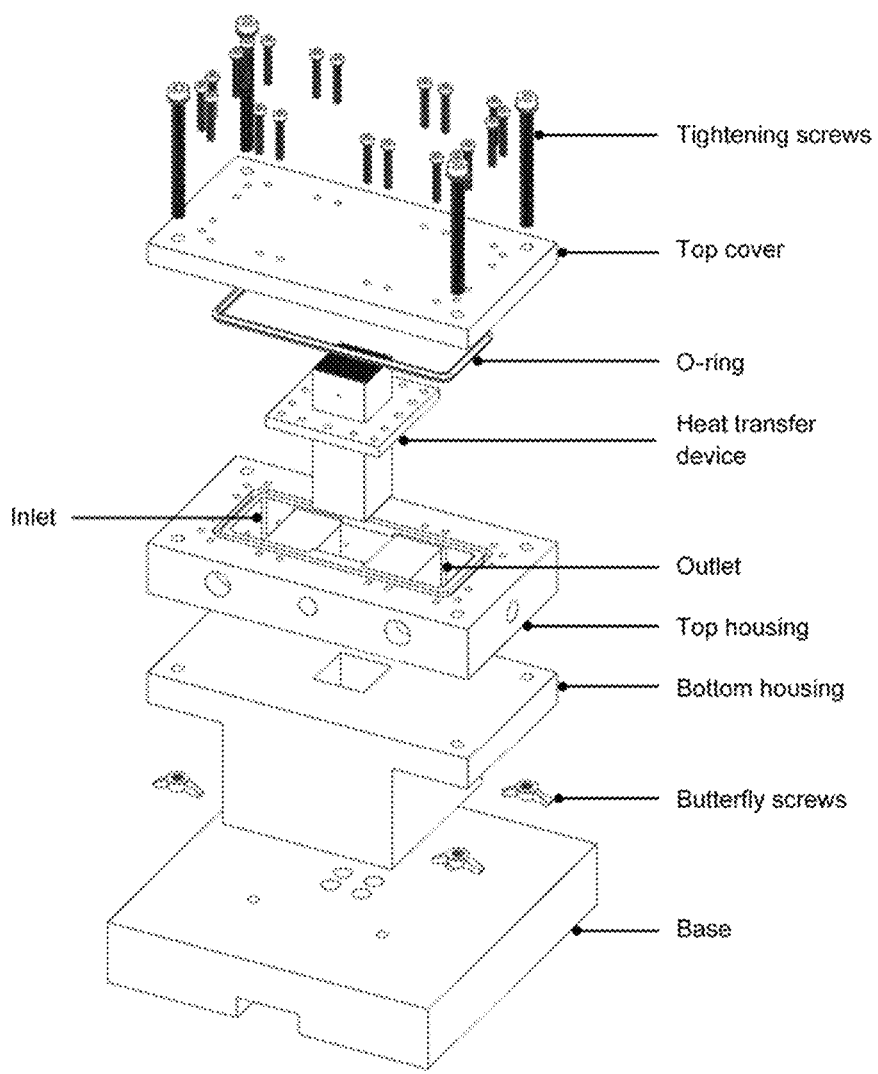
FIG. 2 Exploded view of the micro-channels test section

FIG. 1 shows the schematic diagram of the flow loop, with the exploded view of the test section is shown in FIG. 2.

Figure 3:
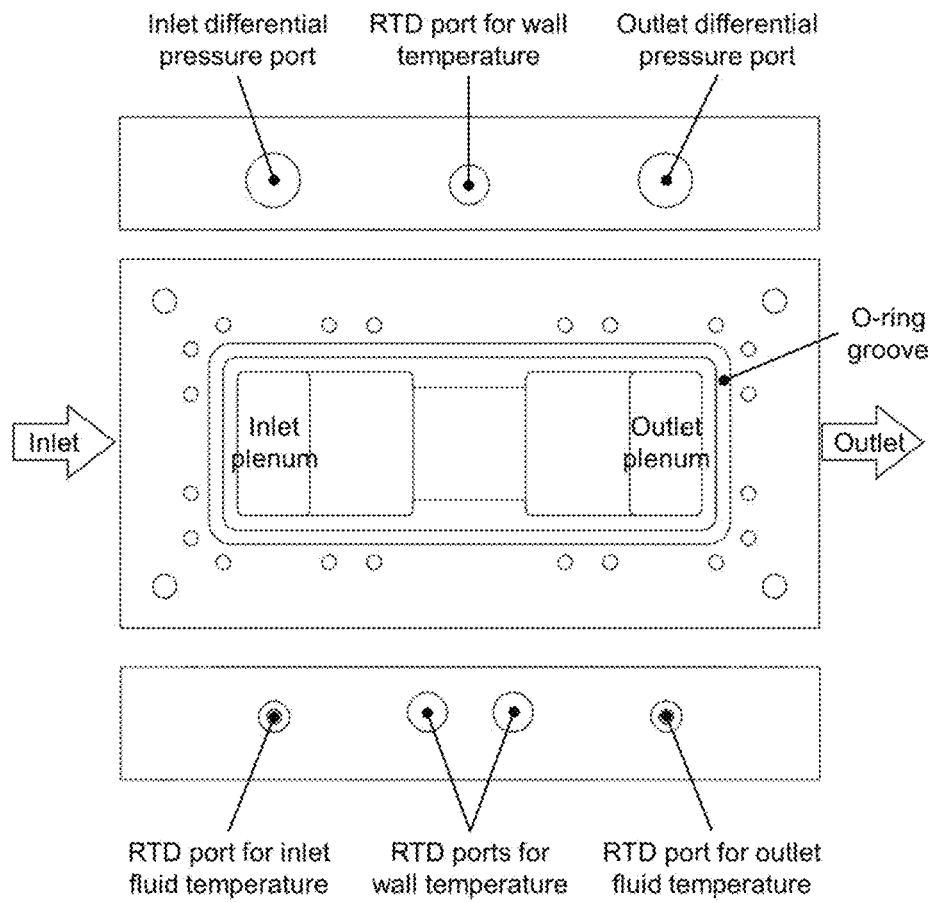
FIG. 3 Location of temperature and pressure ports

The test section consists of three main parts: the top cover, the housings and the micro-channel heat sink. The top cover is made of clear Polycarbonate, while the housings (top and bottom housings and base) are made of Teflon to minimise heat loss. The top housing shown in FIG. 3 has an inlet and outlet plenum, and four holes are drilled through these plenums to permit the insertion of RTD probes and differential pressure transducer. A groove is cut on the top housing where an O-ring is placed. The top cover is screwed on top of the top housing with tightening screws and it presses against the O-ring, which seals assembly from leakages.

Figure 4:
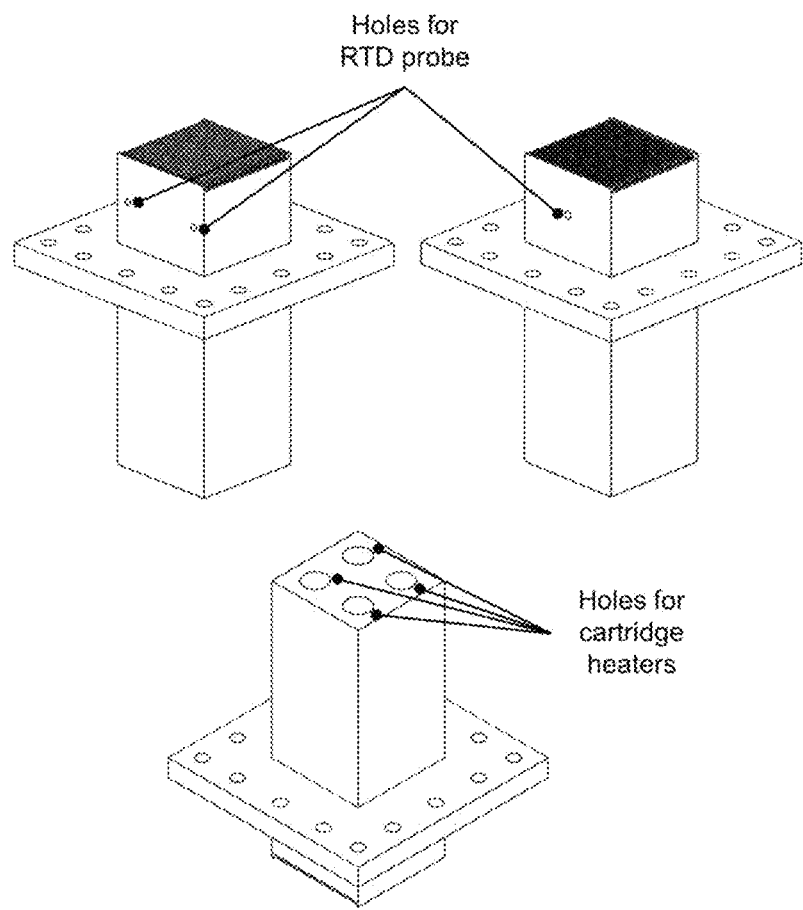
FIG. 4 Location of RTD and cartridge heater holes

Three small holes for the RTD probes at 3 mm (most upstream), 12.5 mm and 22 mm (most downstream) from the inlet of the micro-channels are drilled through the copper block at 8.8 mm below the channel surface to measure the stream-wise surface temperature of the micro-channels. Four holes are drilled through the height of the copper block at the bottom to hold the four cartridge heaters. The locations of these holes are depicted in FIG. 4.

The straight- and oblique-finned micro-channel heat sinks are made from copper blocks with a footprint area of 25 mm×25 mm, on which 40 parallel micro-channels are machined with wire-cut electro-discharge machining process. The dimensions of the straight- and oblique-finned micro-channels are given in Table 1.

TABLE 1

Dimensions of the micro-channels

| Parameter | Unit | Nominal dimension | Actual dimension Straight fins | Actual dimension Oblique fins |
|---|---|---|---|---|
| Material | — | — | Copper | |
| Footprint area, A | mm² | — | 25 × 25 | |
| Number of channels, $N_{ch}$ | — | — | 40 | |
| Number of fins, $N_{fin}$ | — | — | 39 | 780 |
| Channel width, $w_{ch}$ | mm | 0.30 | 0.35 | 0.34 |
| Channel depth, $H_{ch}$ | mm | 1.20 | 1.19 | 1.17 |
| Fin thickness, $t_{fin}$ | mm | 0.30 | 0.26 | 0.25 |
| Oblique-cut width, $w_{ob}$ | mm | — | — | 0.15 |
| Oblique angle, θ | ° | 27 | — | 26.6 |

Experimental Procedures

Detailed experimental procedures are listed below:
1. Valves on the main flow loop are ensured to be opened and those on the degassing loop are closed before activating the pump.
2. The required flow rate is set by varying the speed of the pump and the power supplied to the cartridge heaters is set to the desired value after the flow rate and the inlet fluid temperature are stabilised.
3. A 15-minute waiting time is observed in each test run, when all temperature readings became stable. Temperature and pressure data are logged at a frequency of 25 Hz and averaged over a 60-second period.
4. The heat flux is then increased for the next test condition, and Procedure 3 is repeated.

A total of five mass fluxes are tested, ranging from 175 kg/m²s to 350 kg/m²s. Inlet temperature of FC-72 is maintained at 29.5° C., and the heat flux is increased until the incipience of CHF.

Heat Loss Characterisation

Figure 5:
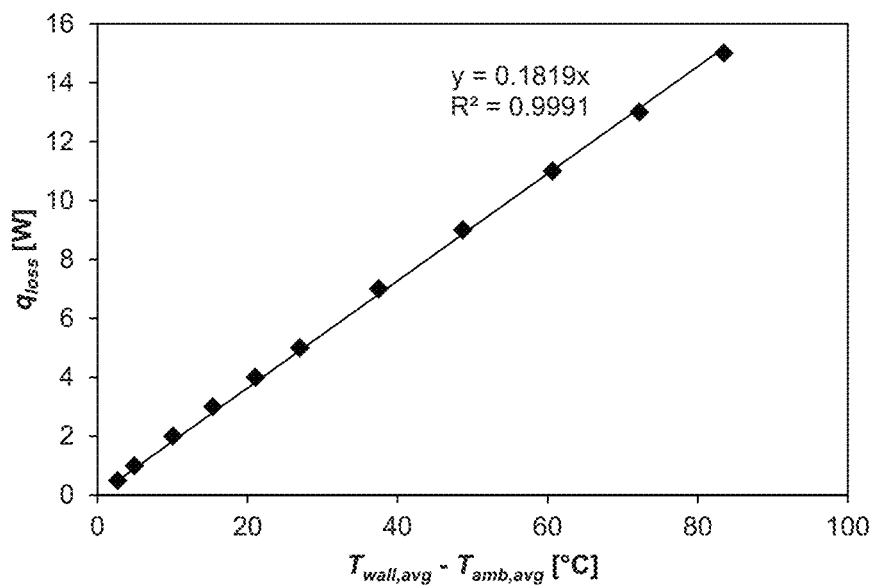
FIG. 5 Heat loss characterisation curve

It is found that the heat loss varies linearly with the difference between the average wall and average ambient temperatures in FIG. 5, as given by Equation (1).

$$q_{loss}=0.1819(T_{wall,avg}-T_{amb,avg})[W] \quad (1)$$

Data Reduction

As the differential pressure ports are located upstream and downstream of the micro-channels in the inlet and outlet plenum, the pressure drop measurement represents the combined losses due to the frictional loss in the micro-channels and minor losses across the bends from the inlet plenum to the inlet manifold and outlet manifold to the outlet plenum, as well as abrupt contraction and expansion from the inlet and manifolds to the micro-channels.

Heat Transfer

The effective heat absorbed by the fluid, after taking into account heat loss, is given by $$q_{eff}=q_{supplied}-q_{loss} \quad (2)$$

where $$q_{supplied}=VI \quad (3)$$

V and I are obtained by measuring the voltage drop and current across the shunt resistor.

The associated heat flux in Equation (4) is calculated based on the footprint area of the micro-channel heat sink. This is also the reported heat flux that the heat sink can dissipate.

$$q''_{eff} = \frac{q_{eff}}{WL} \quad (4)$$

Subcooled FC-72 ($T_{f,in}<T_{sat}$) is pumped into the test section for all test conditions. The micro-channels can therefore be divided into two regions: an upstream subcooled region and a downstream saturated region. The location of zero thermodynamic equilibrium quality (x=0) serves as a dividing point between the two regions. The length of the two regions can be evaluated based on energy balance as $$L_{sub} = \frac{\dot{m}c_p(T_{sat,x=0} - T_{f,in})}{q''_{eff}W} \quad (5)$$

and $$L_{sat} = L - L_{sub} \quad (6)$$

where $T_{sat,x}=0$ is the saturation temperature at the location of zero thermodynamic equilibrium quality.

Local heat transfer coefficient is computed only at the location of the most downstream thermocouple, which relates to the greatest amount of saturated boiling. For uniform heat flux conditions, the bulk fluid temperature in the single-phase region vary linearly with the energy balance $$T_f = T_{f,in} + \frac{q''_{eff}Wz}{\dot{m}c_p} \quad (7)$$

Within the saturated region, the bulk fluid temperature is equals to the local saturation temperature which is taken corresponding to the local pressure obtained as a linear interpolation between the inlet and outlet pressures, which can be justified based on very low measured pressure drop, as in Equation (8).

$$T_f=T_{sat}, \text{in saturated region, where } T_{sat}=f(P_{out}) \quad (8)$$

The thermal properties of FC-72 are shown in Equations (9) to (14). Units of P is bar and T is °C.

$$T_{sat}=51.6304+24.098 lnP+0.5967/P-4.2899P+0.2159P^2 \quad (9)$$

$$c_{p,f}=1000(1.0096+1.55\times10^{-3}T) \quad (10)$$

$$k_f=9.0754\times10^{-2}[8.9897\times10^{-9}(T+273.15)^2-1.293\times10^{-3}(T+273.15)+1] \quad (11)$$

$$h_{fg}=1000(88.3048-5.239 lnP-0.1398/P-3.8508P+0.27063P^2) \quad (12)$$

$$\mu_f=-5.924\times10^{-10}(T+273.15)^3+6.333\times10^{-7}(T+273.15)^2-2.286\times10^{-4}(T+273.15)+2.821\times10^{-2} \quad (13)$$

$$\rho_f=-1.618\times10^{-11}T^6-1.269\times10^{-9}T^5+1.027\times10^{-6}T^4-4.239\times10^{-4}T^3+4.973\times10^{-2}T^2-4.014T+1.755\times10^3 \quad (14)$$

The local heat transfer coefficient can then be calculated using Equation (15).

$$h_{loc3} = \frac{q_{eff}}{A_{total}(T_{wall3} - T_f)} \quad (15)$$

where $A_{total}$ is the total convective heat transfer area. $A_{total}$ for the straight fins is given in Equation (16) and for the oblique fins is given in Equations (17) to (19).

For the straight-finned micro-channels, the calculation of $A_{total}$ is straightforward, and is evaluated as $$A_{total}=(N_{fin}+1)(w_{cs}+2\eta H)L \quad (16)$$

On the other hand, $A_{total}$ (for the oblique-finned micro-channels is given by $$A_{total}=A_{unfin}\eta A_{fin} \quad (17)$$

where $A_{unfin}$ is the unfinned surface area at the bottom of the channels and $A_{fin}$ is fin area, as in Equations (15) and (16), respectively.

$$A_{unfin}=\text{Base area of heat sink}-\text{Base area of oblique fins}=WL-N_{fin}w_{fin}l_{fin} \quad (18)$$

$$A_{fin}=N_{fin}H_{fin}p_{fin} \quad (19)$$

For both micro-channel configurations, local fin efficiency is used to account for the drop in temperature along the fin. An adiabatic fin tip condition is assumed due to the non-conductive material of the Polycarbonate top cover and the corresponding fin efficiency is given as $$\eta = \frac{\tanh(mH_{fin})}{mH_{fin}} \quad (20)$$

where m is the fin parameter, given by $$m = \left(\frac{h_{loc3}p_{fin}}{k_{Cu}A_{cs}}\right)^{\frac{1}{2}} \quad (21)$$

Equations (20) and (21) are iteratively solved to obtain $h_{loc3}$.

As direct wall temperature measurements at the bottom of the channel are not available, the one-dimensional heat conduction assumption is used to extrapolate the temperature readings of the thermocouple. Thus, the local wall temperature at the most downstream location is given by Equation (22).

$$T_{wall3} = T_{loc3} - \frac{q''_{eff} d}{k_{Cu}} \quad (22)$$

The local thermodynamic quality is calculated using energy balance and is given by the following equation $$x_{loc3} = \frac{q''_{eff} W(z - L_{sub})}{\dot{m} h_{fg}} \quad (23)$$

Figure 6:
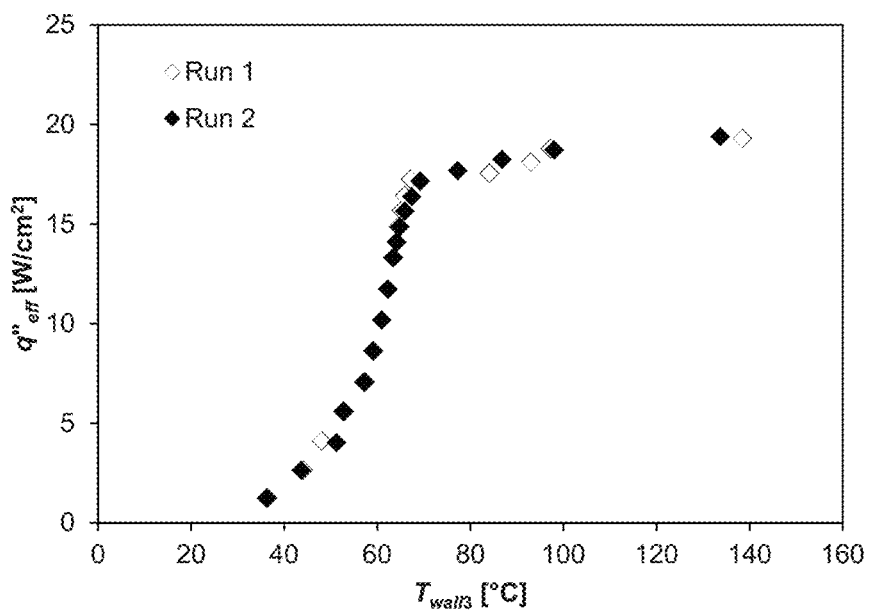
FIG. 6 Temperature data repeatability for G=175 kg/m$^2$s
Figure 7:
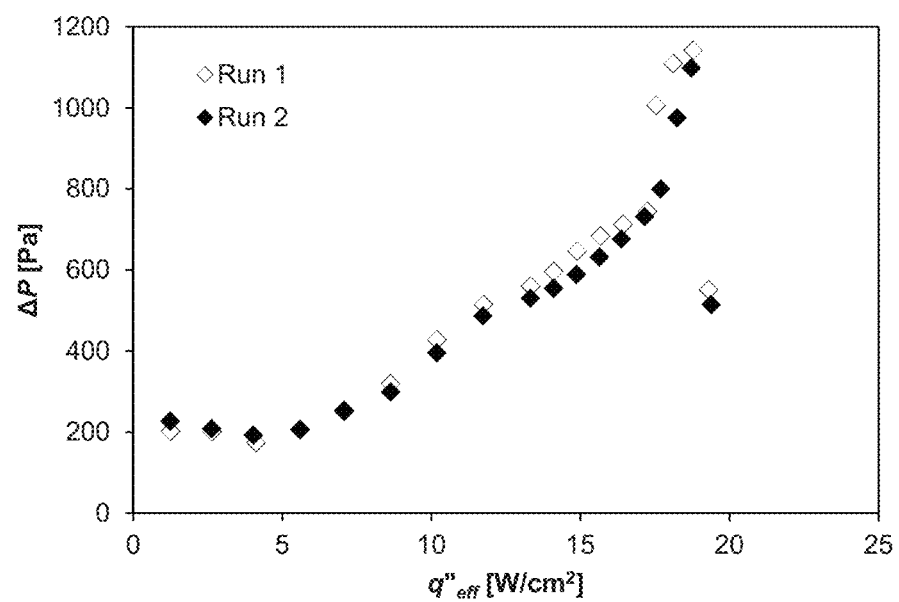
FIG. 7 Pressure drop data repeatability for G=175 kg/m$^2$s

FIG. 6 and FIG. 7 show the plots from the temperature and pressure drop repeatability tests, respectively at G=175 kg/m²s for the straight-finned micro-channels. The trends for both sets of readings are found to be repeatable, with minimum deviations of 0.05° C. and 0.3 Pa and maximum deviations of 6.8° C. and 206.2 Pa for the temperature and pressure drop data, respectively.

Figure 8:
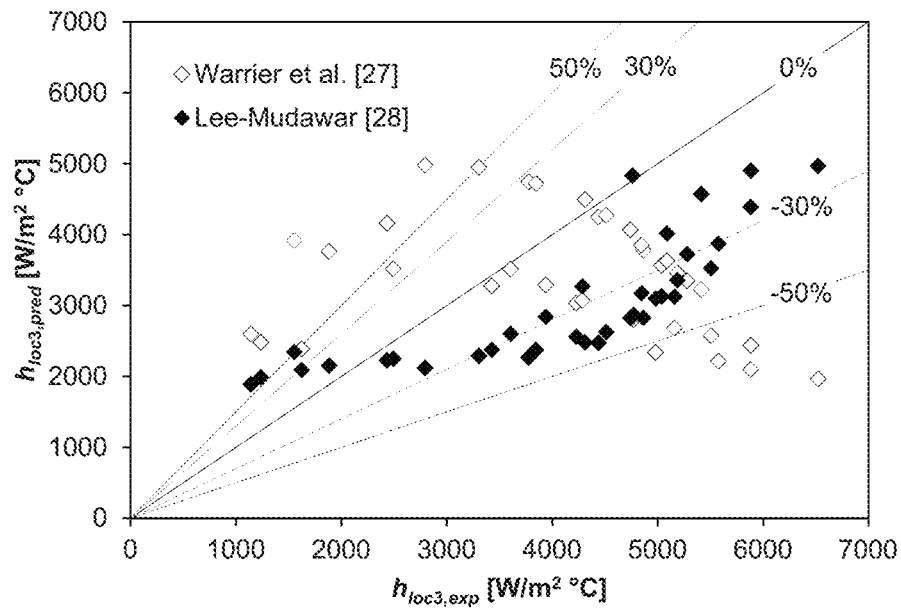
FIG. 8 Comparison of the various heat transfer correlations with experimental data FIG. 9 Boiling curves as a function of flow rate for the straight- and oblique-finned FIG. 10(a) Variation of heat transfer coefficient with effective heat flux as a function of flow rate for the straight- and oblique-finned micro-channels FIG. 10(b) Variation of heat transfer coefficient with local vapour quality as a function of flow rate for the straight- and oblique-finned micro-channels FIG. 11(a) Bubbles generation in the oblique-finned FIG. 11(b) Bubbles generation in the straight-finned micro-channels FIG. 12(a) Thin liquid-film surrounding the oblique fins with negative images attached FIG. 12(b) Thin liquid-film surrounding the straight fins with negative images attached FIG. 13 Variation of critical heat flux with flow rate for the straight- and oblique-finned micro-channels FIG. 14 Micro-channels wall temperature uniformity curves for the straight- and oblique-finned micro-channels at different heat fluxes and flow rates FIG. 15 Variation of pressure drop with effective heat flux as a function of flow rate for the straight- and oblique-finned micro-channels FIG. 16(a) Pressure drop fluctuations at flow rates of 100 ml/min for the straight- and oblique-finned micro-channels FIG. 16(b) Pressure drop fluctuations at flow rates of 200 ml/min for the straight- and oblique-finned micro-channels FIG. 17(a) Inlet pressure fluctuations for the straight- and oblique-finned micro-channels at 100 ml/min for low heat flux conditions FIG. 17(b) Inlet pressure fluctuations for the straight- and oblique-finned micro-channels at 100 ml/min for medium heat flux conditions FIG. 17(c) Inlet pressure fluctuations for the straight- and oblique-finned micro-channels at 100 ml/min for high heat flux conditions FIG. 18(a) Inlet pressure fluctuations for the straight- and oblique-finned micro-channels at 175 ml/min for low heat flux conditions FIG. 18(b) Inlet pressure fluctuations for the straight- and oblique-finned micro-channels at 175 ml/min for medium heat flux conditions FIG. 18(c) Inlet pressure fluctuations for the straight- and oblique-finned micro-channels at 175 ml/min for high heat flux conditions FIG. 19 Development of flow boiling process in a single straight-finned micro-channel FIG. 20 Development of flow boiling process in a single oblique-finned micro-channel FIG. 21(a) Boiling curves as a function of oblique angles for the oblique-finned micro-channels at low flow rates FIG. 21(b) Boiling curves as a function of oblique angles for the oblique-finned micro-channels at medium flow rates FIG. 21(c) Boiling curves as a function of oblique angles for the oblique-finned micro-channels at high flow rates FIG. 22(a) Variation of heat transfer coefficient with effective heat flux for different oblique angles at low flow rates FIG. 22(b) Variation of heat transfer coefficient with effective heat flux for different oblique angles at medium flow rates FIG. 22(c) Variation of heat transfer coefficient with effective heat flux for different oblique angles at high flow rates FIG. 23(a) Variation of pressure drop with effective heat flux for different oblique angles at low flow rates FIG. 23(b) Variation of pressure drop with effective heat flux for different oblique angles at medium flow rates FIG. 23(c) Variation of pressure drop with effective heat flux for different oblique angles at high flow rates FIG. 24(a) Inlet pressure fluctuations for different oblique angles at 100 ml/min FIG. 24(b) Inlet pressure fluctuations for different oblique angles at 200 ml/min for low heat flux condition

The mean absolute error (MAE) to determine the accuracy of each correlation is given in Equation (24), with its corresponding plot in FIG. 8.

$$MAE = \frac{1}{n} \sum_{n=1}^{n=36} \frac{|h_{loc3,exp,n} - h_{loc3,pred,n}|}{h_{loc3,exp,n}} \times 100\% \quad (24)$$

Figure 9:
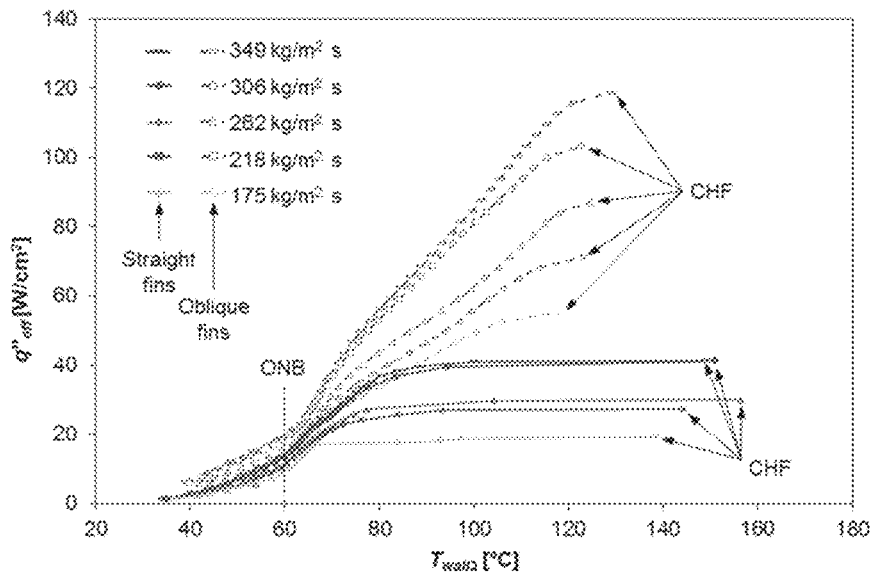

FIG. 9 plots the comparison of the boiling curves for both the straight- and oblique-finned geometries at different mass fluxes. The boiling curves are plotted between wall temperature at the most downstream location ($T_{wall3}$) instead of wall superheat ($\Delta T_{sat}$), and applied effective heat flux for direct and easier comparison.

After the onset of nucleate boiling (ONB), the slopes of the boiling curves for the oblique-finned micro-channels remained rather stable. This indicates a more stable boiling phenomenon compared to the straight-finned geometry. At higher effective heat flux, the boiling curves of the straight-finned micro-channels exhibit a sudden decrease in slope. This is primarily an indication of premature dry-out occurring in individual micro-channel. The oblique fins are able to dissipate higher heat fluxes at the same wall temperature compared to the straight fins throughout the entire range of flow rate tested.

At a wall temperature of less than around 60° C., the increment in effective heat flux causes a slow rise in the wall temperature. When boiling incipient occurs, the effective heat flux increases rapidly with the wall temperature, characterised by the sharp increase in the slope of the boiling curves. This sudden increase of the slope of the boiling curves occurs around 4° C. above the saturation temperature of FC-72 and marks the onset of nucleate boiling (ONB).

When the heat flux is increased further beyond the ONB, the slopes of the boiling curves for the oblique-finned micro-channels remained rather stable, even at high heat fluxes, indicative of a more stable boiling phenomenon compared to the straight-finned geometry. At higher effective heat flux, the boiling curves of the straight-finned micro-channels exhibit a sudden decrease in slope, where the wall temperature increases rapidly with a small increase in heat flux. This is primarily an indication of premature dry-out occurring in individual micro-channels, which causes the sudden decreases in the heat transfer coefficients. It is interesting to note that the oblique fins may be able to dissipate higher heat fluxes at the same wall temperature compared to the straight fins throughout the entire range of heat flux tested. This shows that the heat transfer performance of the oblique-finned micro-channels is fairly more superior to its straight-finned counterpart.

The critical heat flux (CHF) values for both the oblique fins and straight fins are indicated in FIG. 9 of their respective boiling curves. It is clearly seen that CHF is very much delayed for the case of the oblique-finned micro-channels for all five mass fluxes, compared to the straight-finned micro-channels. On top of that, CHF conditions occur at lower wall temperatures for the oblique fins.

Figure 10:
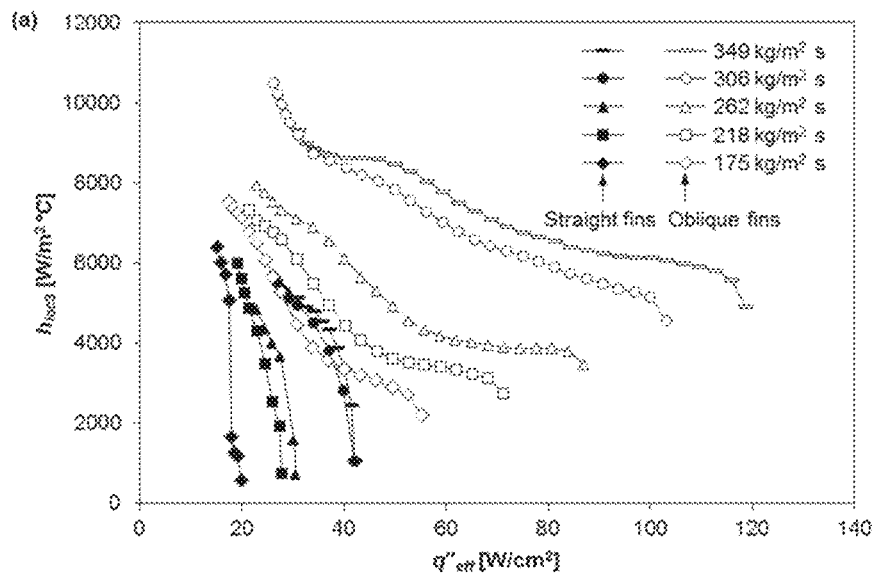
Figure 10:
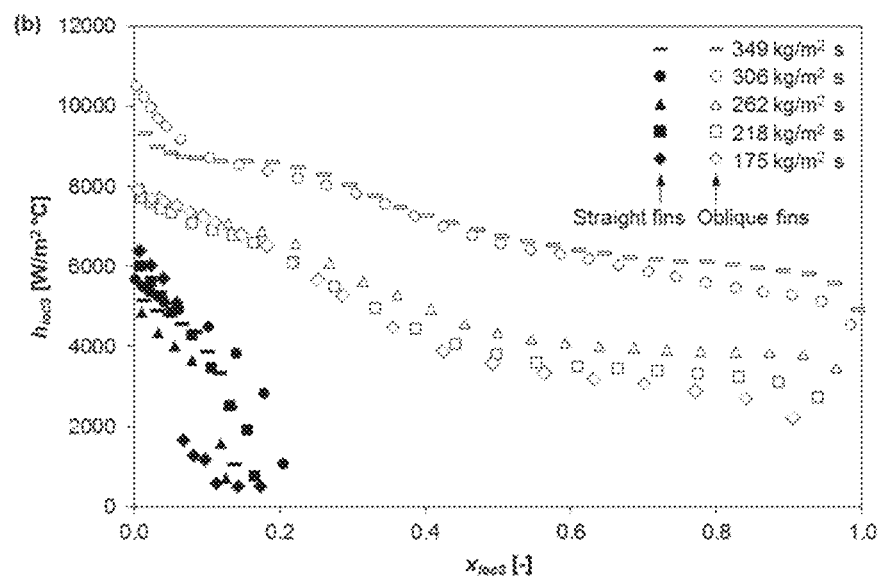

Flow boiling heat transfer coefficients are plotted against effective heat flux and local vapour quality in FIG. 10(a) and FIG. 10(b), respectively. Similar to the boiling curves, the figures clearly reveal significant augmentation in heat transfer for the oblique-finned micro-channels. Enhancements in the heat transfer coefficients of between 1.2 to 6.2 times are observed for the range of mass flux tested.

FIG. 10(b) shows the relationship between the local heat transfer coefficient and local vapour quality for the straight and oblique fins geometry. As can be seen, the range of vapour quality for the straight-finned micro-channels is from 0 to 0.204, whereas the range of local vapour quality for the oblique-finned micro-channels is from 0 up to nearly unity, at 0.988. Judging by this huge difference in the range of vapour qualities, it can be deduced that premature dry-out occurs in the straight-finned micro-channels, which gives rise to premature CHF conditions. As a result, CHF for the oblique-finned geometry is delayed and occurs at a much higher heat flux than that for the straight-finned micro-channels.

The heat transfer coefficients clearly reveal significant augmentation in heat transfer for the oblique-finned micro-channels. The straight-finned geometry experiences a notable decrease in heat transfer coefficient, while its oblique-finned counterpart observed a less significant decreasing trend. The range of vapour quality for the straight-finned micro-channels is from 0 to 0.204, versus 0 up to 0.988 for the oblique-finned micro-channels. It can be deduced that premature dry-out occurs in the straight-finned micro-channels, which gives rise to premature CHF conditions.

The straight-finned geometry experiences a notable decrease in heat transfer coefficient, while its oblique-finned counterpart observed a less significant decreasing trend. This can be attributed to the different physical boiling phenomena in both micro-channel geometries, which is explained using high-speed visualisations. In the nucleate boiling region, the larger surface area of the oblique fins increases the amount of active nucleation sites, thus promoting the density of bubble growth.

Figure 11:
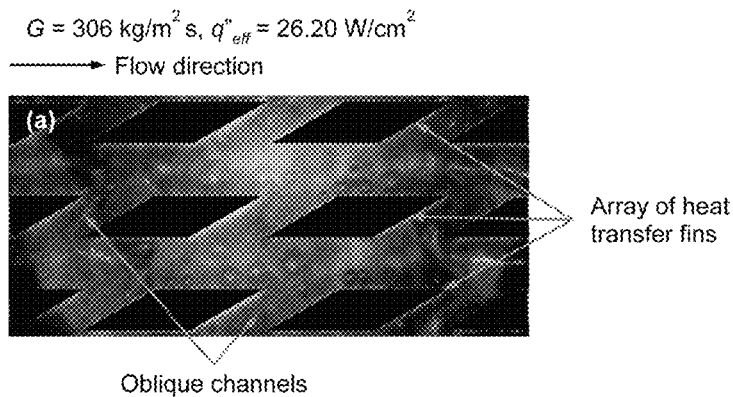
Figure 11:
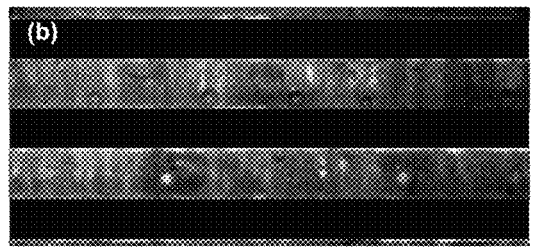
Figure 12:
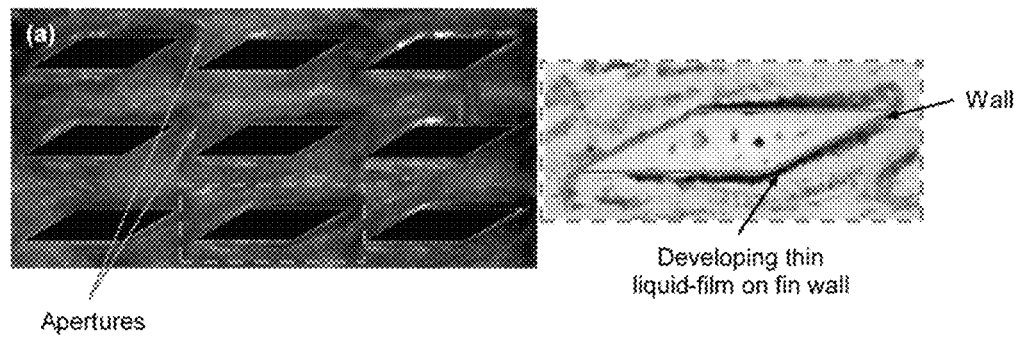
Figure 12:
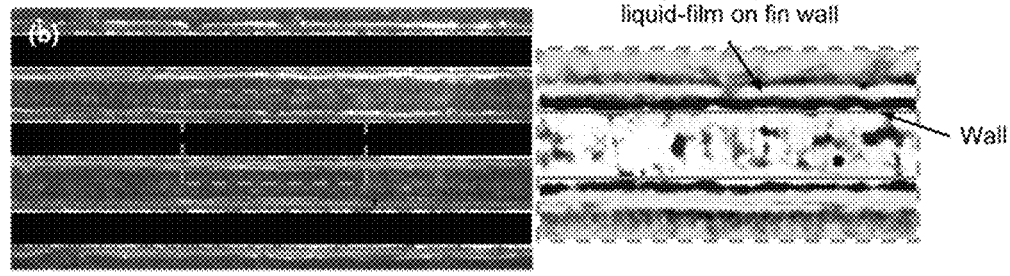

As illustrated by FIGS. 11(a)-(b), the increase in the density of bubbles generated in the micro-channels can be observed. This enables more effective heat transfer to the flowing fluid, which is seen in the increase in heat transfer coefficient of the oblique fins over its straight fins counterpart. On the other hand, in the convective boiling region, a constantly developing thin liquid-film surrounding the oblique fins can be seen in FIG. 12(a), as opposed to a fully developed thin liquid-film for the straight fins in FIG. 12(b).

The continuous interruption of the boundary layer is recognised to be beneficial for single-phase heat transfer, using the oblique-finned micro-channels. As a result, the disruption of the liquid thin-film by the secondary oblique channels, which creates a constantly developing boundary layer, is likewise beneficial for the case of two-phase convective boiling heat transfer in the oblique-finned micro-channels.

The larger surface area of the oblique fins increases the amount of active nucleation sites, thus promoting the density of bubble growth. The increase in the density of bubbles generated in the micro-channels can be observed. This enables more effective heat transfer to the flowing fluid, which is seen in the increase in heat transfer coefficient of the oblique fins over its straight fins counterpart. A constantly developing thin liquid-film surrounding the oblique fins can be seen in FIG. 12(a), as opposed to a fully developed thin liquid-film for the straight fins in FIG. 12(b). The interruption of the thermal boundary layer is recognised to be beneficial for single-phase heat transfer.

It can be inferred that the disruption of the liquid thin-film by the secondary oblique channels is likewise beneficial for the case of two-phase convective boiling heat transfer in the oblique-finned micro-channels.

Figure 13:
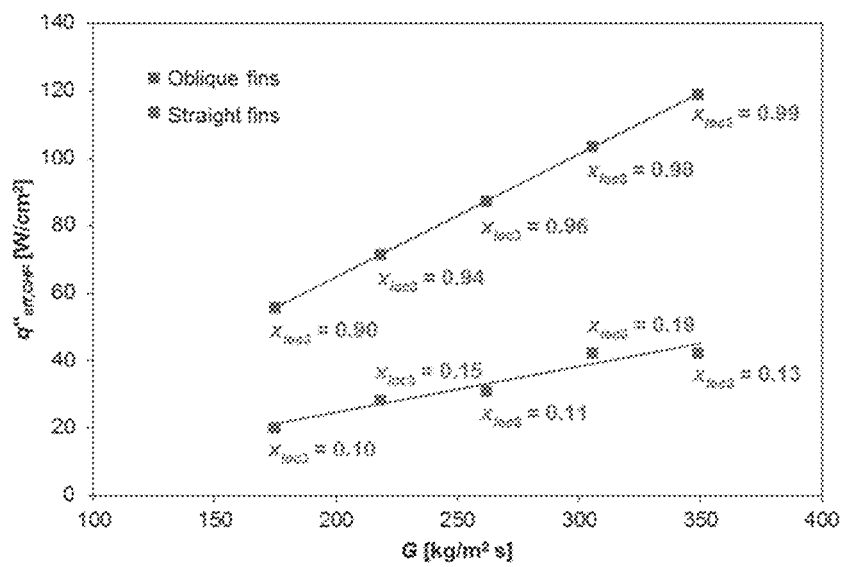

The relationship between CHF and mass flux is depicted in FIG. 13, with the local vapour quality as indicated for each data point. The CHF values increase linearly with mass flux for both type of micro-channels structure. This is because a larger heat flux is required to reach the same vapour quality at a higher mass flux. The variation of the CHF with mass flux for both geometries exhibits similar trend with conventional-scale channels.

The CHF of the oblique-finned micro-channels is much larger than that of the straight-finned micro-channels, with an increase of 2.5 to 2.8 times for the range of mass flux in FIG. 13. Boiling commences at high liquid superheats in micro-channels with significant shortage of nucleation sites. Under such conditions, the phase-change process tends to be exceedingly rapid, instigating hydrodynamic fluctuations. Pressure fluctuations and premature CHF conditions may be related to each other, which in turn, causes boiling instabilities. The improved flow boiling stability and uniformity offered by the oblique-finned geometry over its straight-finned counterpart seem to be able to control pressure fluctuations, and this may be considered to be the primary cause of the delay in the incipience of CHF.

As shown in FIG. 13, CHF for straight fins occurs at vapour qualities of between 0.10 and 0.19, while CHF for oblique fins only occurs at vapour qualities exceeding 0.9. On top of that, the CHF vapour qualities for straight fins fluctuate as mass flux is increased. This is another indication of premature dry-out in the straight-finned geometry. Serious pressure oscillations, which is caused by flow reversal during rigorous boiling in the micro-channels is the main contribution towards premature CHF.

Surface temperature reduction and minimisation of temperature gradient on the device are two of the most important objectives in thermal management of electronics. These are crucial aspects in flow boiling in micro-channels to prevent thermal stresses on the electronic device which will usually lead to damage of the electronic components. A decrease in the average wall temperature of 1.2 to 1.5 times is observed for the oblique-finned micro-channels at a given heat flux. This lower wall temperature coupled with an increase in the total heat transfer area have a direct influence on the computed flow boiling heat transfer coefficients, which are much greater for the case of the oblique fins.

The CHF of the oblique-finned micro-channels is much larger than that of the straight-finned micro-channels for the range of flow rate. The improved flow boiling stability and uniformity offered by the oblique-finned geometry is able to control pressure fluctuations, and this may be considered as the primary cause of the delay in the incipience of CHF. CHF for straight fins occurs at vapour qualities of between 0.10 and 0.19, while CHF for oblique fins only occurs at vapour qualities exceeding 0.9.

This is another indication of premature dry-out in the straight-finned geometry.

Figure 14:
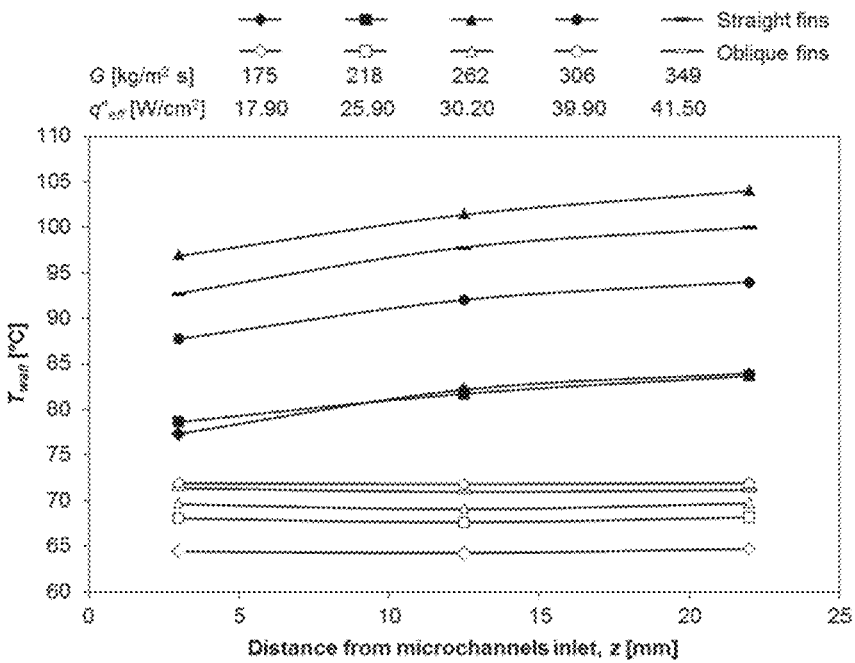

FIG. 14 shows the trends of wall temperature at three different locations in the micro-channels. The three locations are measured near the inlet, in the middle and near the outlet of the micro-channels test section. Besides maintaining lower wall temperatures at a given heat flux and mass flux, the oblique-finned geometry also exhibits a fairly uniform temperature distribution in the stream-wise direction for all conditions. This uniform temperature variation is due to a more stable boiling process offered by the oblique fins. Additional active nucleation sites contributed by the fin walls on the secondary micro-channels trigger more bubble generation and expansion. This higher density of nucleating bubbles, in turn, increases the rate of heat transfer which results in a more uniform and lower wall temperature.

The oblique-finned geometry exhibits a fairly uniform temperature distribution in the stream-wise direction for all conditions. This uniform temperature variation is due to a more stable boiling process offered by the oblique fins.

Figure 15:
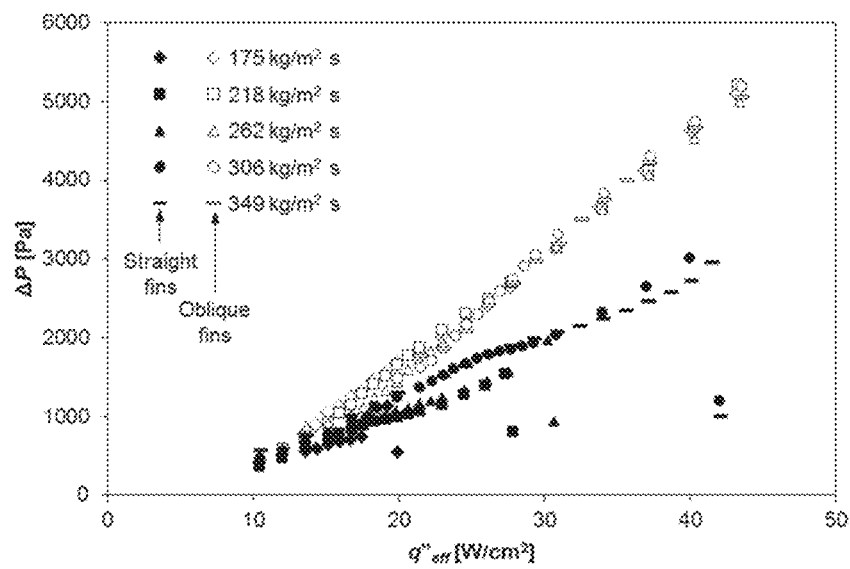

Two-phase pressure drop is plotted against effective heat flux in FIG. 15, as a function of mass flux. Generally, two-phase pressure drop increases with heat flux for a given mass flux for both the straight- and oblique-finned geometries due to the vapour acceleration component and two-phase frictional component. As can be seen, the pressure drop in the oblique-finned micro-channels is consistently higher than that of the straight-finned micro-channels, with a much steeper slope for all mass fluxes. This is most likely caused by the sudden change in direction of the flow, where fluid and bubbles are being forced into the adjacent micro-channels through the secondary oblique cuts. Although the generation of secondary flow is beneficial for heat transfer, the higher pressure drop penalty suffered by the oblique-finned micro-channels has to be taken into consideration.

An interesting point to note is that at CHF, the pressure drop for the straight fins declined abruptly for all the five mass fluxes tested. Severe flow reversal in the straight micro-channels may cause bubbles to be pushed back into the inlet plenum, which then agglomerate and block the incoming fluid from entering the micro-channels. This leads to a sudden decrease in flow rate through the micro-channels, and the differential pressure transducer responds to this sudden decrease by registering a reduction in pressure drop.

Pressure drop in the oblique-finned micro-channels is consistently higher than that of the straight-finned micro-channels, with a much steeper slope for all flow rates. This is most likely caused by the sudden change in direction of the flow, where fluid and bubbles are being forced into the adjacent micro-channels through the secondary oblique cuts. The net pressure drop in the oblique fins can be moderated by fine-tuning the oblique-finned structure so as to control the amount of secondary flow generated.

Figure 16:
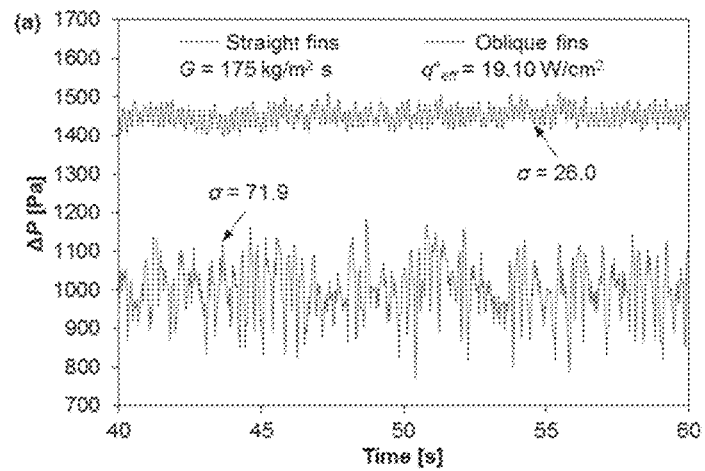
Figure 16:
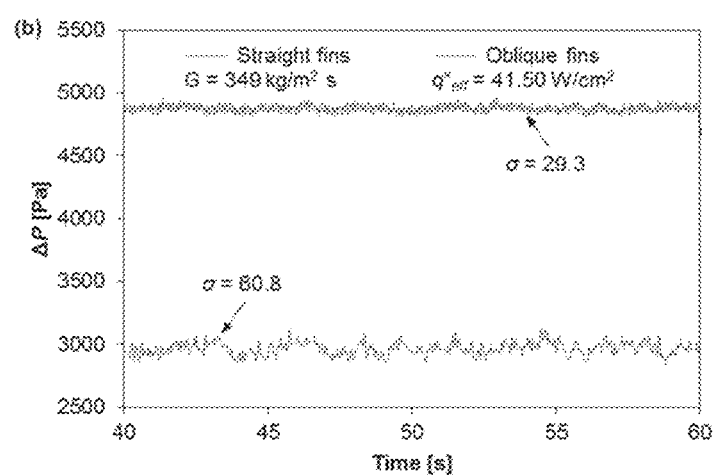

The above description further justifies that the CHF which occurs in the straight-finned micro-channels is mainly due to flow instabilities, which is effectively mitigated by the oblique-finned structure. As shown in FIGS. 16(a) and (b), the pressure drop fluctuations for the oblique fins are very minor relative to its straight fins counterpart, although the net pressure drop for the former is much higher. However, the net pressure drop in the oblique fins can be moderated by fine-tuning the oblique-finned structure so as to control the amount of secondary flow generated. Pressure drop fluctuations for the oblique fins are very minor relative to its straight fins counterpart. This shows that the oblique fins are able to stabilise the flow boiling process.

The inlet pressure fluctuation curves are presented in FIGS. 17(a)-(c) and FIGS. 18(a)-(c) for two mass fluxes of G=175 kg/m²s and G=306 kg/m²s, respectively, at low, medium and high heat fluxes. The inlet pressure is selected for comparison because the inlet pressure transmitter, located near the inlet port of the test section, is able to capture boiling instabilities associated with flow reversals.

Figure 17:
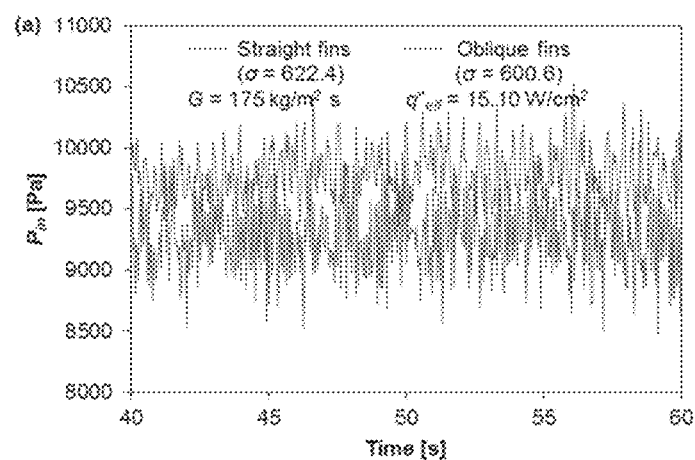
Figure 17:
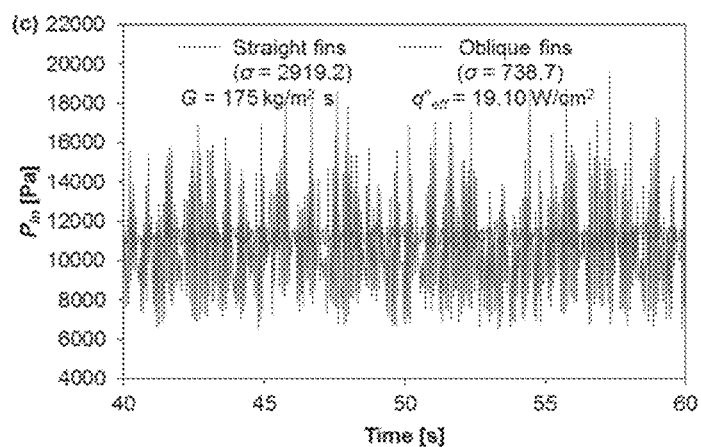
Figure 17:
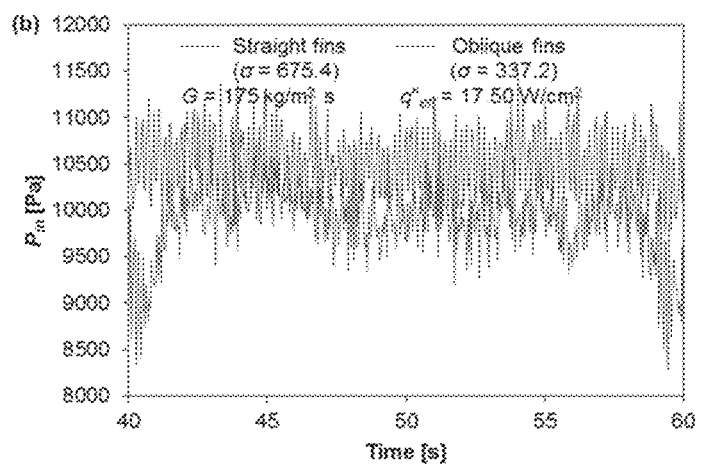
Figure 18:
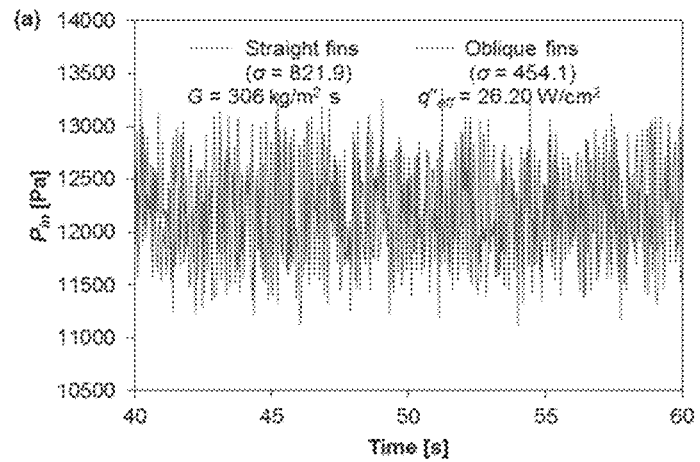
Figure 18:
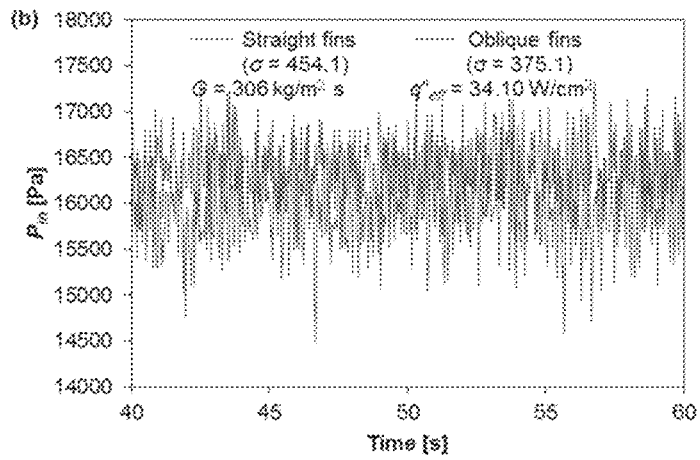
Figure 18:
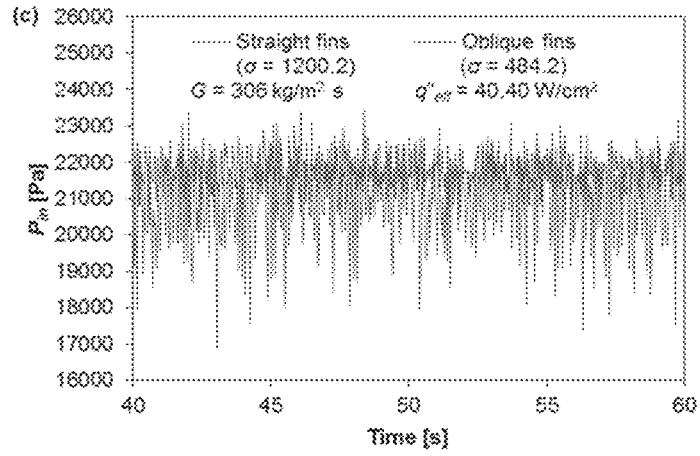

It can be seen in the plots that inlet pressure fluctuations in the oblique-finned micro-channels are smaller compared to its straight-finned counterpart. At G=175 kg/m²s, reductions in the inlet pressure fluctuations of 1.0 times, 2.0 times and 3.6 times at low, medium and high heat fluxes, respectively, are obtained. On the other hand, at G=306 kg/m²s, reductions of 1.8 times, 1.2 times and 2.5 times at low, medium and high heat fluxes, respectively can be seen. Mitigation of the inlet pressure instabilities is particularly notable at high heat flux condition, as seen in FIGS. 17(c) and 18(c). This is due to premature dry-out experienced by the straight-finned micro-channels, which then leads to very unstable premature CHF conditions. For the case of the oblique fins, the branched secondary channels act as bridges for neighbouring straight channels to "communicate" with each other, thus eliminating sudden pressure spikes arising from flow resistance.

The inlet pressure fluctuations in the oblique-finned micro-channels are smaller compared to its straight-finned counterpart. Mitigation of the inlet pressure instabilities is particularly notable at high heat flux condition, as seen in FIGS. 17(c) and 18(c) due to very unstable premature CHF conditions. The branched secondary channels in the oblique fins act as bridges for neighbouring straight channels to "communicate" with each other, thus eliminating sudden pressure spikes.

Figure 19:
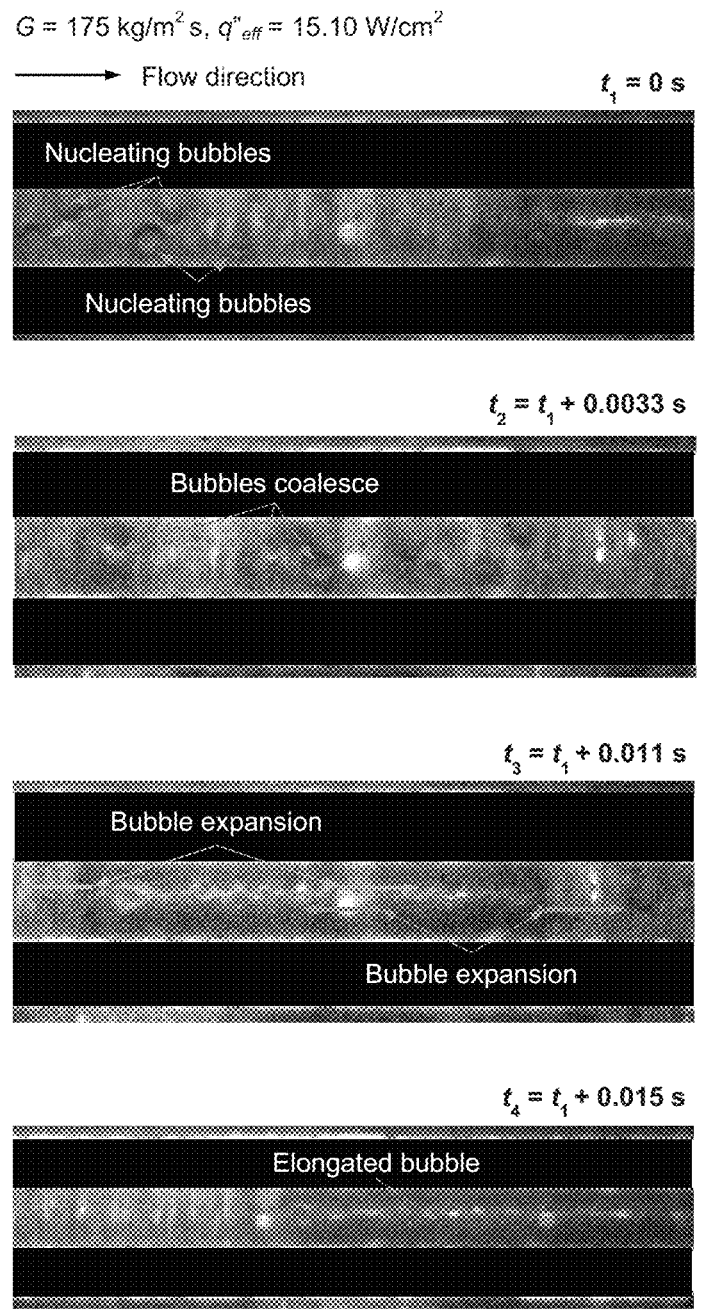
Figure 20:
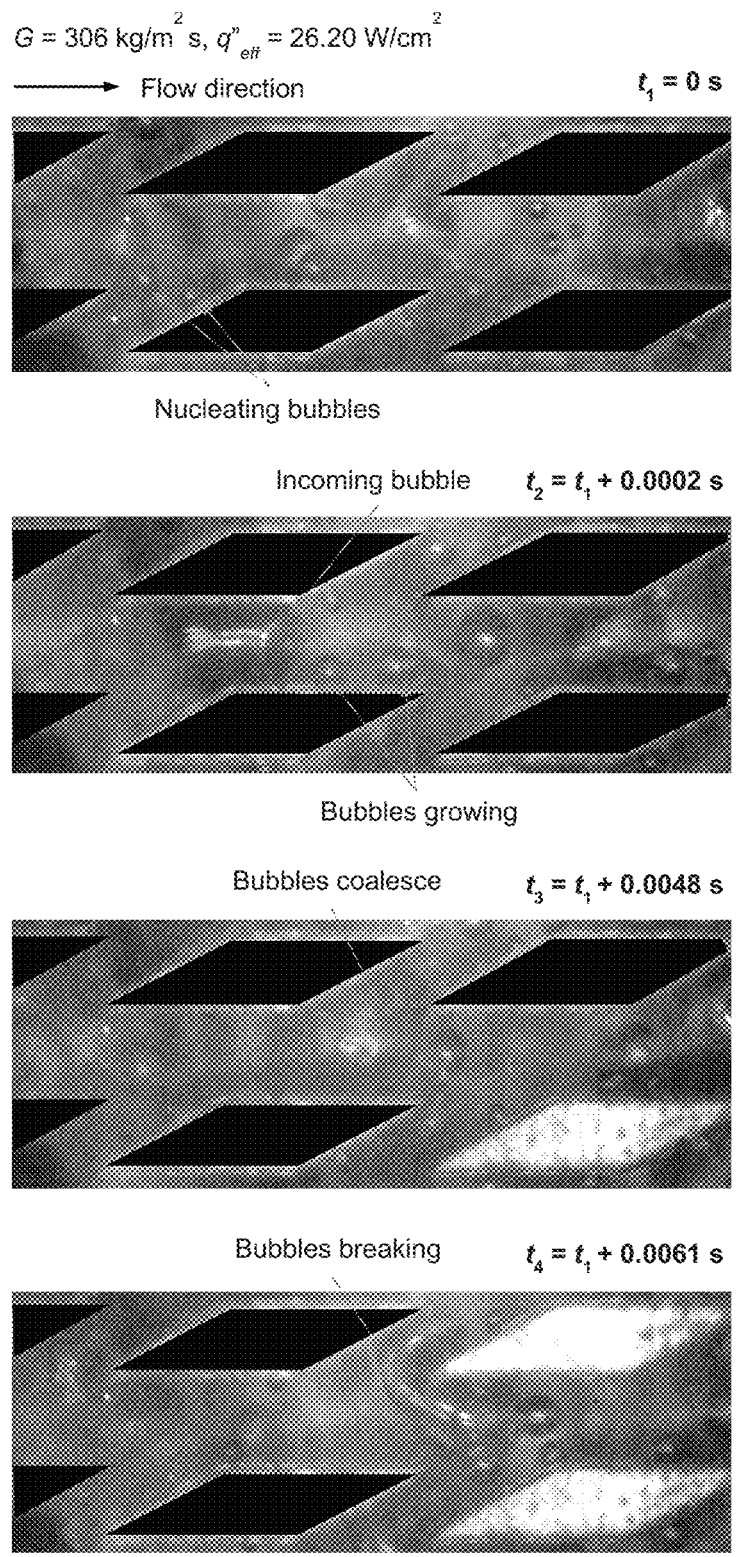

The reasons for this reduction in instabilities will be explained using high-speed visualisations. Sequential high-speed flow images are illustrated in FIG. 19 and FIG. 20 for a single straight-finned and oblique-finned micro-channel, respectively. These figures show the development of the boiling process near the location of the third temperature sensor, where boiling is most intense. The images in FIG. 20 appear brighter because the oblique fins with larger surface area allow more light to illuminate the micro-channels.

The first frame ($t_1$=0 s) in FIG. 19 shows several bubbles nucleating from the fin walls. As time progresses, the bubbles start to grow and coalesce with adjacent bubbles ($t_2$=$t_1$+0.00033 s), which then expand stream-wise ($t_3$=$t_1$+0.011 s). Two expanded bubbles finally merge into an elongated bubble ($t_4$=$t_1$+0.015 s). The elongated bubble occupies the entire width of the micro-channel and is forced to expand in the stream-wise direction, thus increasing flow resistance and the likelihood of flow reversal. Significant flow boiling instabilities associated with flow reversal for the straight-finned geometry is detected and recorded in the inlet pressure fluctuation curves in FIGS. 17(a)-(c) and 18(a)-(c).

In FIG. 20, the first frame ($t_1$=0 s) shows bubbles nucleating from the fin walls in the secondary channel. The bubbles grow ($t_2$=$t_1$+0.0002 s) and coalesce with an incoming bubble to form a larger bubble ($t_3$=$t_1$+0.0048 s). The final frame ($t_4$=$t_1$+0.0061 s) reveals the responsibility of the oblique fin in diminishing flow reversal. As the expanded bubble flows further downstream, it is sheared by the sharp edge of the oblique fin, causing it to break into two smaller bubbles. These bubbles will recombine with other bubbles downstream and the sequence of shearing, breaking and recombining repeat itself throughout the micro-channels. This constant shearing and breaking of enlarged bubbles and slugs minimise the possibility of bubbles getting confined to the micro-channel width, which contribute significantly to a more stable flow boiling process as seen in the inlet pressure fluctuation curves in FIGS. 17(a)-(c) and 18(a)-(c).

Experimental Results

Figure 21:
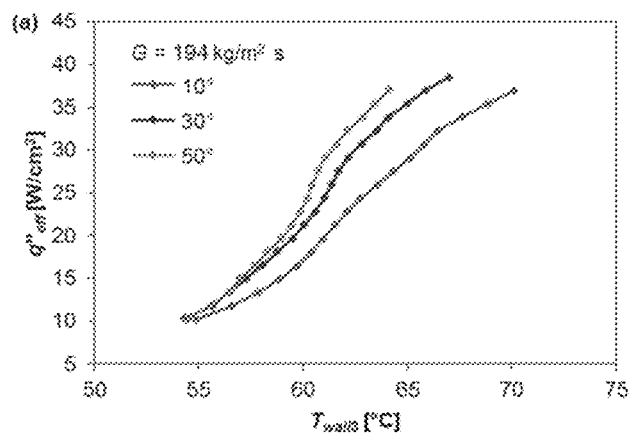
Figure 21:
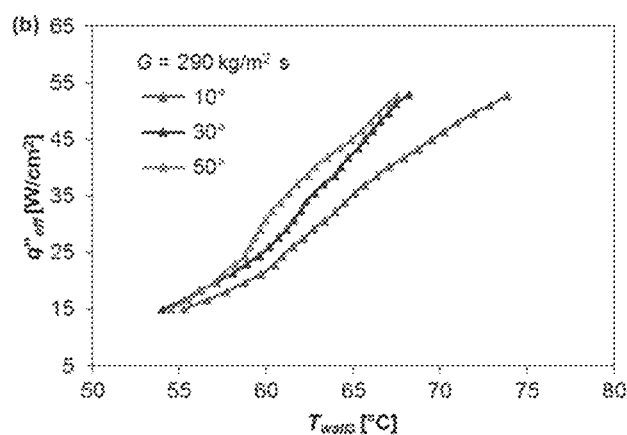
Figure 21:
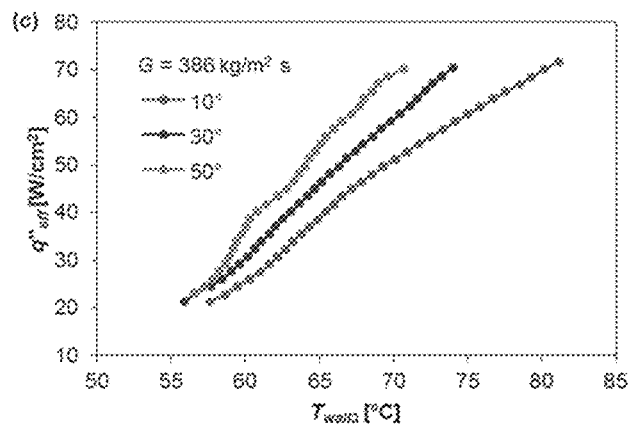

1. Boiling curves [FIG. 21(a) to (c)]

The 10° oblique-finned micro-channels provide the least effective heat transfer compared to the other two cases at all flow rates tested. Heat transfer is enhanced as the oblique angle is increased from 10° to 30° for all flow rates; however, this enhancement becomes less apparent as the oblique angle is increased from 30° to 50°.

Figure 22:
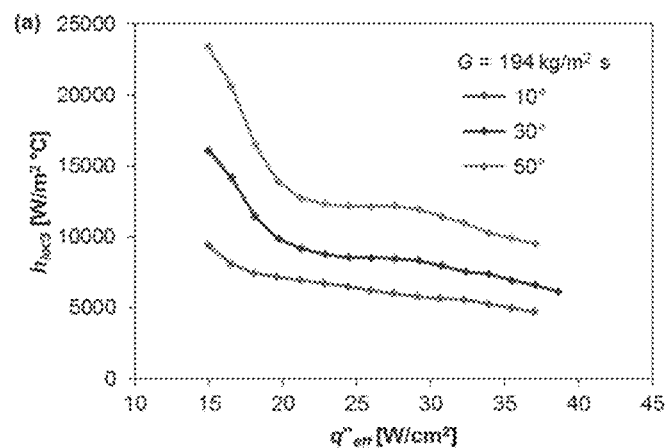
Figure 22:
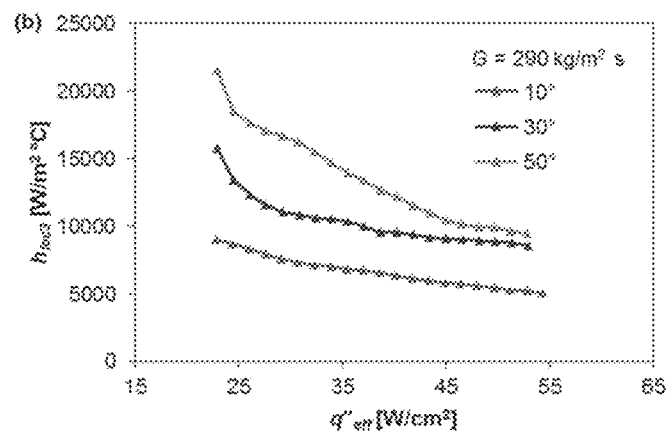
Figure 22:
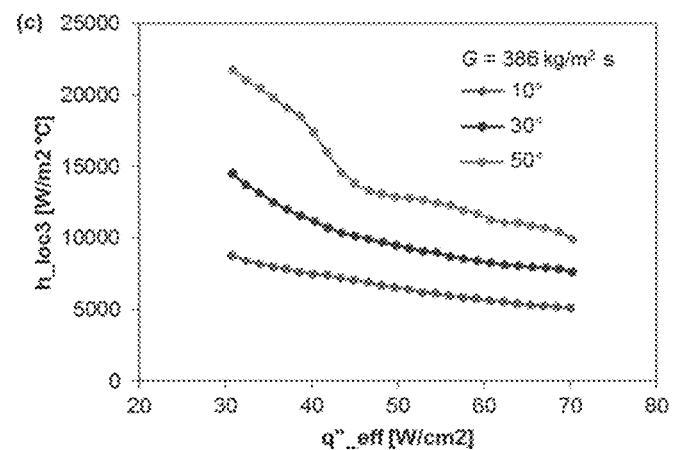

2. Heat transfer coefficient [FIG. 22(a) to (c)]

Oblique angles have quite a strong influence on heat transfer coefficient. Heat transfer coefficient increases with oblique angle from 10° to 50°. The heat transfer coefficients show a strong relationship with heat flux at low effective heat fluxes, which is an indication of a nucleate boiling dominated mechanism. At higher effective heat fluxes, nucleation begins to be suppressed as bubbles elongate and form vapour slugs (tail-end of nucleate boiling).

Figure 23:
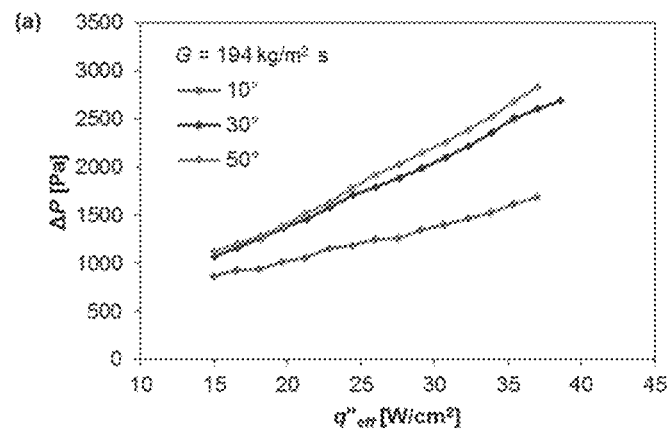
Figure 23:
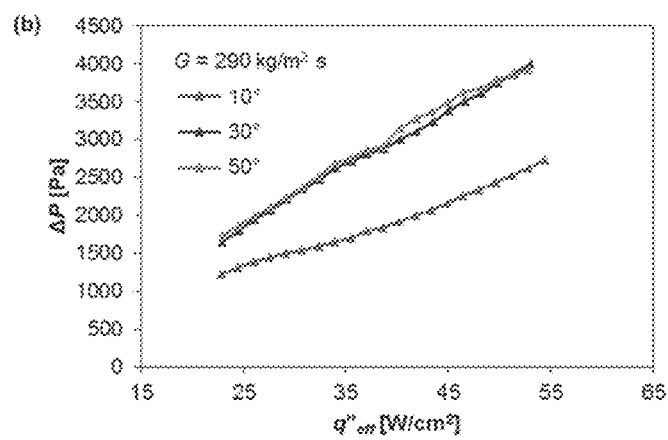
Figure 23:
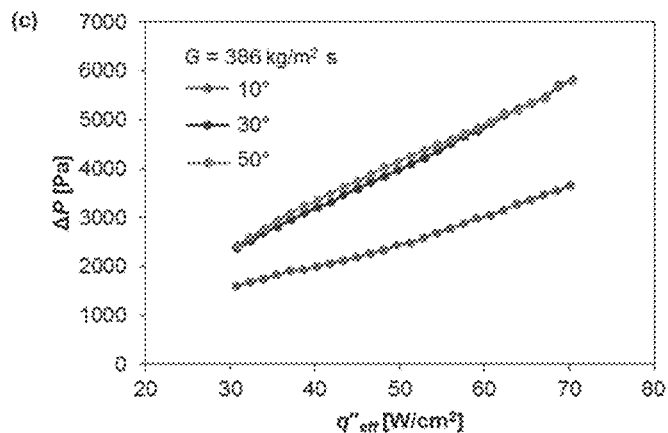
Figure 24:
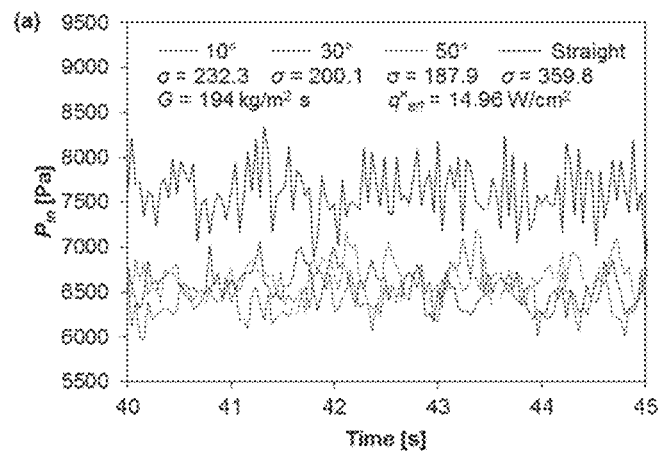
Figure 24:
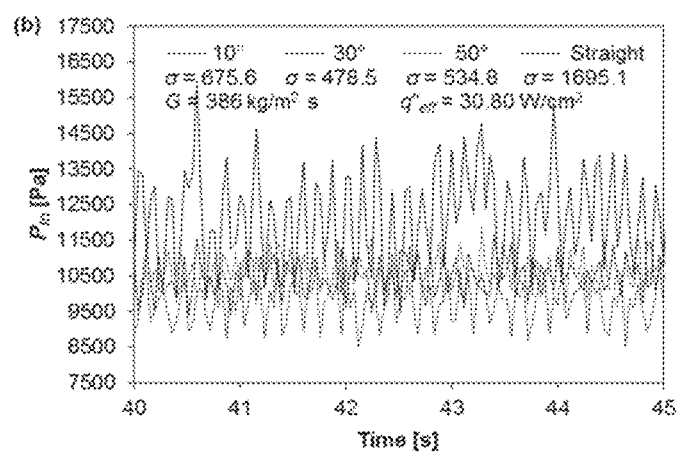

3. Pressure drop [FIG. 23(a) to (c)]

The increment of oblique angle from 10° to 30° causes a rather substantial increase in the pressure drop penalty at all flow rates. However, as the oblique angle is further varied from 30° to 50°, the pressure drop penalty is seen to be almost negligible, especially for the case of medium and high flow rates.

Advantages

1. The heat transfer performance of the oblique-finned micro-channels is significantly better than its straight-finned counterpart, with augmentations in heat transfer coefficient of between 1.2 to 6.2 times. This is likely due to the increase in the density of bubbles generated in the micro-channels in the nucleate boiling regime and a constantly developing thin liquid-film in the convective boiling regime.

2. The disruption of the liquid thin-film by the secondary oblique channels is beneficial for the case of two-phase convective boiling heat transfer in the oblique-finned micro-channels.

3. The critical heat flux of the oblique-finned micro-channels is much larger than that of the straight-finned geometry. Increments of 2.5 to 2.8 times in the CHF values are observed for the oblique fins in the experiments, which is contributed by a more stable flow boiling process offered by the oblique fins.

4. Two-phase pressure drop in the oblique-finned micro-channels is consistently higher than the straight-finned micro-channels, with a rise of up to 1.7 times at the highest comparable heat flux. This is possibly caused by the sudden change in the flow direction, where fluid is being forced to flow through secondary channels. However, pressure drop fluctuations in the oblique-finned geometry are much lower compared to the straight-finned geometry.

5. Pressure instabilities in the oblique-finned micro-channels are relatively smaller than that in the straight-finned micro-channels, with reduction in standard deviations of close to 4 times. This phenomenon is because of the constant shearing and breaking of enlarged bubbles and slugs by the sharp corners of the oblique fins, which minimises the possibility of bubbles getting confined to the micro-channel width.

The invention claimed is:

1. A method of producing two phase flow in a heat transfer device comprising the steps of:
    passing a heat transfer fluid through an inlet of the heat transfer device;
    the heat transfer device having an array of heat transfer fins in spaced relation, primary spaces between the heat transfer fins defining primary channels parallel to a path from the inlet to an outlet, and oblique spaces between the heat transfer fins defining oblique channels arranged at an angle to the primary channels;
    wherein a temperature of the heat transfer fluid at the inlet is no greater than a saturation temperature of said heat transfer fluid;
    wherein the heat transfer device includes apertures between the oblique and primary channels, and further comprising the steps of: said apertures interrupting thin liquid-film formation; said thin liquid film continuously developing at a convective boiling region of said oblique channels, and
    wherein the critical heat flux within the device ranges from 56 W/cm$^2$ and 120 W/cm$^2$.

2. The method according to claim 1, further comprising the step of bubbles nucleating from surfaces of walls of said heat transfer fins, said surfaces defining nucleate boiling regions.

3. The method according to claim 2, wherein the oblique channels provide pathways for bubbles formed from the nucleate boiling regions between the primary channels.

4. The method according to claim 1, wherein the angle is in the range of 10° to 50°.

5. The method according to claim 1, wherein the angle is in the range of 30° to 50°.

6. The method according to claim 1, wherein the angle is 50°.

7. The method according to claim 1, wherein the heat transfer device dissipates applied heat flux greater than 20 W/cm$^2$.

8. The method according to claim 1, wherein a mass flux for the heat transfer fluid is in the range 175 kg/m$^2$s to 349 kg/m$^2$s.

9. The method according to claim 1, wherein a mass flux for the heat transfer fluid is in the range 218 kg/m$^2$s to 306 kg/m$^2$s.

10. The method according to claim 1, wherein a mass flux for the heat transfer fluid is 262 kg/m$^2$s.

11. A method of producing two phase flow in a heat transfer device comprising the steps of:
    passing a heat transfer fluid through an inlet of the heat transfer device;
    the heat transfer device having an array of heat transfer fins in spaced relation, primary spaces between the heat transfer fins defining primary channels parallel to a path from the inlet to an outlet, and oblique spaces between the heat transfer fins defining oblique channels arranged at an angle to the primary channels;
    wherein a temperature of the heat transfer fluid at the inlet is no greater than a saturation temperature of said heat transfer fluid;
    wherein the heat transfer device includes apertures between the oblique and primary channels, and further comprising the steps of: said apertures interrupting thin liquid-film formation; said thin liquid film continuously developing at a convective boiling region of said oblique channels,
    wherein the critical heat flux within the device ranges from 56 W/cm$^2$ and 120 W/cm$^2$, and
    wherein a vapour quality at the outlet is between 0.5 and 0.988.

12. A method of producing two phase flow in a heat transfer device comprising the steps of:
    passing a heat transfer fluid through an inlet of the heat transfer device;
    the heat transfer device having an oblique-finned configuration comprising an array of heat transfer fins in spaced relation, primary spaces between the heat transfer fins defining primary channels parallel to a path from the inlet to an outlet, and oblique spaces between the heat transfer fins defining oblique channels arranged at an angle to the primary channels,
    wherein a temperature of the heat transfer fluid at the inlet is no greater than a saturation temperature of said heat transfer fluid,
    wherein the heat transfer device includes apertures between the oblique and primary channels,
    interrupting, by said apertures, thin liquid-film formation, wherein said thin liquid film continuously develops at a convective boiling region of said oblique channels;
    increasing bubble density by providing additional heat transfer area for bubbles to nucleate from surfaces of walls of said heat transfer fins; and
    shearing, at said apertures by the heat transfer fins, bubbles that nucleated from surfaces of walls of said heat transfer fins causing each of the bubbles to break into multiple, smaller bubbles, wherein the multiple, smaller bubbles generated in the oblique channels reduce pressure instabilities,
    wherein the critical heat flux within the device ranges from 56 W/cm$^2$ and 120 W/cm$^2$, and
    wherein the oblique-finned configuration of the heat transfer device has an extended vapour quality range at the outlet from 0.204 to 0.988.

13. The method of claim 12, wherein the extend vapour quality range between the inlet and the outlet comprises 0.5 to 0.988.

14. The method of claim 12, wherein the shearing of the bubbles is such that the bubbles do not agglomerate and the bubbles throttle fresh incoming transfer fluid.

15. The method of claim 1, wherein a vapour quality between the inlet and the outlet ranges from 0.204 to 0.988.

* * * * *